(12) United States Patent
Suzuki et al.

(10) Patent No.: US 8,415,622 B2
(45) Date of Patent: Apr. 9, 2013

(54) INFRARED IMAGING ELEMENT

(75) Inventors: Kazuhiro Suzuki, Tokyo (JP); Hiroto Honda, Yokohama (JP); Ikuo Fujiwara, Yokohama (JP); Hideyuki Funaki, Tokyo (JP); Hitoshi Yagi, Yokohama (JP); Keita Sasaki, Yokohama (JP); Honam Kwon, Kawasaki (JP); Koichi Ishii, Kawasaki (JP); Masako Ogata, Yokohama (JP); Risako Ueno, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/414,941

(22) Filed: Mar. 8, 2012

(65) Prior Publication Data
US 2012/0228497 A1 Sep. 13, 2012

Related U.S. Application Data

(63) Continuation of application No. PCT/JP2009/065847, filed on Sep. 10, 2009.

(51) Int. Cl.
*H01L 25/00* (2006.01)
(52) U.S. Cl. .................................................. 250/332
(58) Field of Classification Search .................... 250/332
See application file for complete search history.

(56) References Cited

U.S. PATENT DOCUMENTS
6,573,504 B2 * 6/2003 Iida et al. .................. 250/338.4

FOREIGN PATENT DOCUMENTS

| JP | 04-158583 | A | 6/1992 |
|---|---|---|---|
| JP | 05-164605 | * | 6/1993 |
| JP | 05-164605 | A | 6/1993 |
| JP | 08-285680 | * | 11/1996 |
| JP | 08-285680 | A | 11/1996 |
| JP | 10-132654 | | 5/1998 |

(Continued)

OTHER PUBLICATIONS

International Search report mailed on Oct. 20, 2009 for International Application No. PCT/JP2009/065847, filed on Sep. 10, 2009. (English).

(Continued)

Primary Examiner — David Porta
Assistant Examiner — Edwin Gunberg
(74) Attorney, Agent, or Firm — Oblon, Spivak, McClelland, Maier & Neustadt, L.L.P.

(57) ABSTRACT

An infrared imaging element according to an embodiment includes: a semiconductor substrate including a stacked structure of a silicon first substrate, and a first insulation film, first cavities being provided on a surface of the first substrate; an infrared detection unit provided in the semiconductor substrate and including, detection cells provided respectively over the first cavities, each of the detection cells having diodes and a second insulation film, the first insulation film converting incident infrared rays to heat, the diodes converting the heat obtained by the first insulation film to an electric signal, a third insulation film having a top face located at a greater distance from the semiconductor substrate as compared with a top face of the second insulation film; and a second substrate provided over the third insulation film. A second cavity is formed between the second substrate and the infrared detection unit.

8 Claims, 12 Drawing Sheets

FOREIGN PATENT DOCUMENTS

| | | | |
|---|---|---|---|
| JP | 2003-156390 | A | 5/2003 |
| JP | 2005-024342 | * | 1/2005 |
| JP | 2005-024342 | A | 1/2005 |
| JP | 2005-236159 | A | 9/2005 |
| JP | 2006-4284 | | 1/2006 |
| JP | 2006-297502 | * | 11/2006 |
| JP | 2006-297502 | A | 11/2006 |
| JP | 2006-317232 | A | 11/2006 |
| JP | 2009-169871 | | 7/2009 |

OTHER PUBLICATIONS

International Preliminary Report on Patentability and Written Opinion issued Apr. 19, 2012 in Application No. PCT/JP2009/066167 (English Translation).

International Preliminary Report on Patentability and Written Opinion issued Apr. 19, 2012 in Application No. PCT/JP2009/065847 (English Translation).

* cited by examiner

INFRARED INCIDENCE DIRECTION

US 8,415,622 B2

INFRARED IMAGING ELEMENT

CROSS-REFERENCE TO RELATED APPLICATION

This application is based upon and claims the benefit of priority from prior PCT/JP 2009/065847 filed on Sep. 10, 2009, the entire contents of which are incorporated herein by reference.

FIELD

Embodiments described herein relate generally to an infrared imaging element.

BACKGROUND

The uncooled infrared sensor (hereafter referred to as infrared imaging element as well) is a device which absorbs condensed infrared rays by using an infrared detection unit having detection cells and converts radiant energy to an electric signal. The detection cell has an infrared absorption material and a thermoelectric conversion element, and thermally isolated from an external system. For implementing such a structure, a technique for forming a surface fine structure or a bulk fine structure is needed. Unlike the cooled infrared sensor, the uncooled infrared sensor has an advantage that it is inexpensive and the size can be made small.

For implementing thermal isolation from the external system, it is important to install detection cells in the vacuum and lower the thermal conductance of a support structure which connects the detection cells to a substrate physically and electrically. It is desirable to keep the atmosphere incorporating the infrared imaging element in the vacuum state in order to enhance the heat insulation of the infrared imaging element. As one technique for that purpose, it is disclosed in JP-A-10-132654 (KOKAI) to incorporate an infrared sensor in a dedicated case and perform vacuum sealing.

As another technique, it is disclosed in JP-A-2005-236159 (KOKAI) to mount an infrared sensor on a hermetically sealed package which has two plate-like members and in which a space surrounded by a joining portion and the two plate-like members is hermetically sealed. As compared with an existing technique of mounting an infrared sensor on a semiconductor package and joining and sealing a window material in a vacuum atmosphere, it is anticipated to mount an infrared sensor on a wafer level package in the respect that the throughput at the time of assembling is improved and the productivity is improved.

In the infrared sensor described in JP-A-2005-236159 (KOKAI) or other infrared sensors mounted on the wafer level package, the sensor substrate and a seal plate are joined typically in the longitudinal direction. In the infrared sensor, the seal plate needs to be formed of a material which transmits infrared rays, such as silicon, unlike a typical visible image sensor. Furthermore, as for joining the sensor substrate and the seal plate together, solder is provided in the joining portion and the solder is melted by heat in a vacuum atmosphere to perform joining.

For playing the role of the window material which transmits infrared rays, the material of the seal plate is determined uniquely to be, for example, silicon. This results in a problem that drastic cost down in the seal process is difficult. Furthermore, since the sensor substrate and the seal plate are joined together by thermal melting of solder causing a temperature rise of several hundred degrees, the infrared sensor is subject to great thermal stress. It becomes an important point in considering the reliability of the infrared sensor.

DETAILED DESCRIPTION

Figure 1:
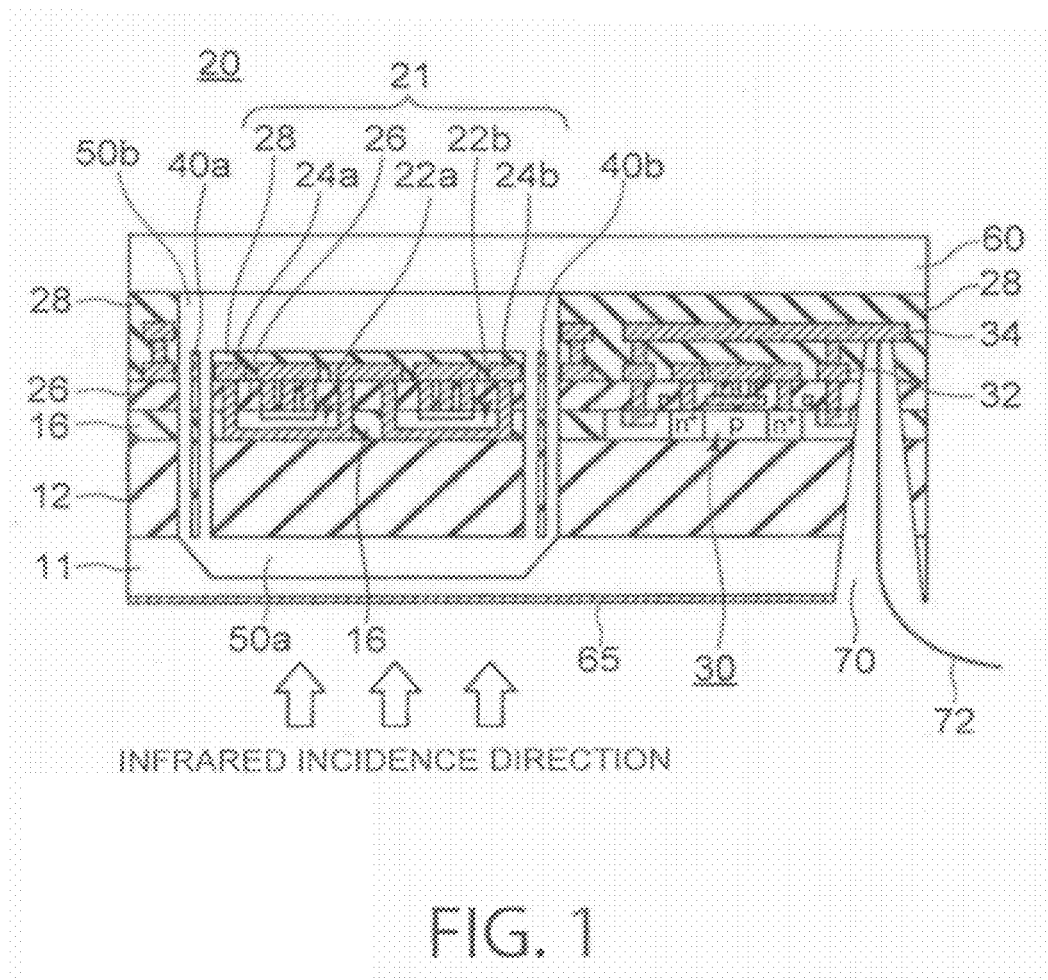
FIG. 1 is a sectional view showing an infrared imaging element according to a first embodiment.
Figure 2:
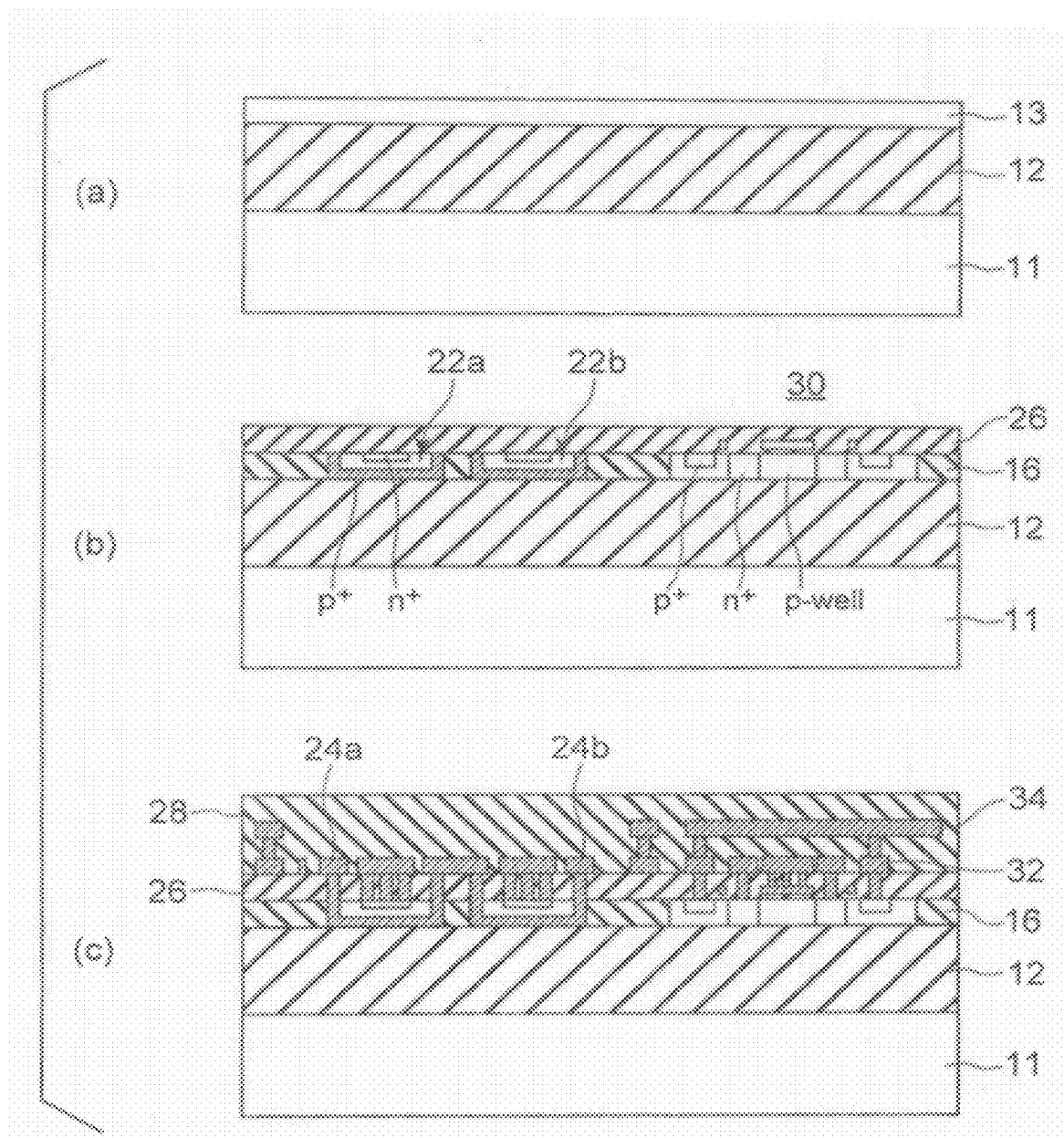
FIGS. 2(a) to 2(c) are sectional views showing a manufacturing process of the infrared imaging element according to the first embodiment.
Figure 3:
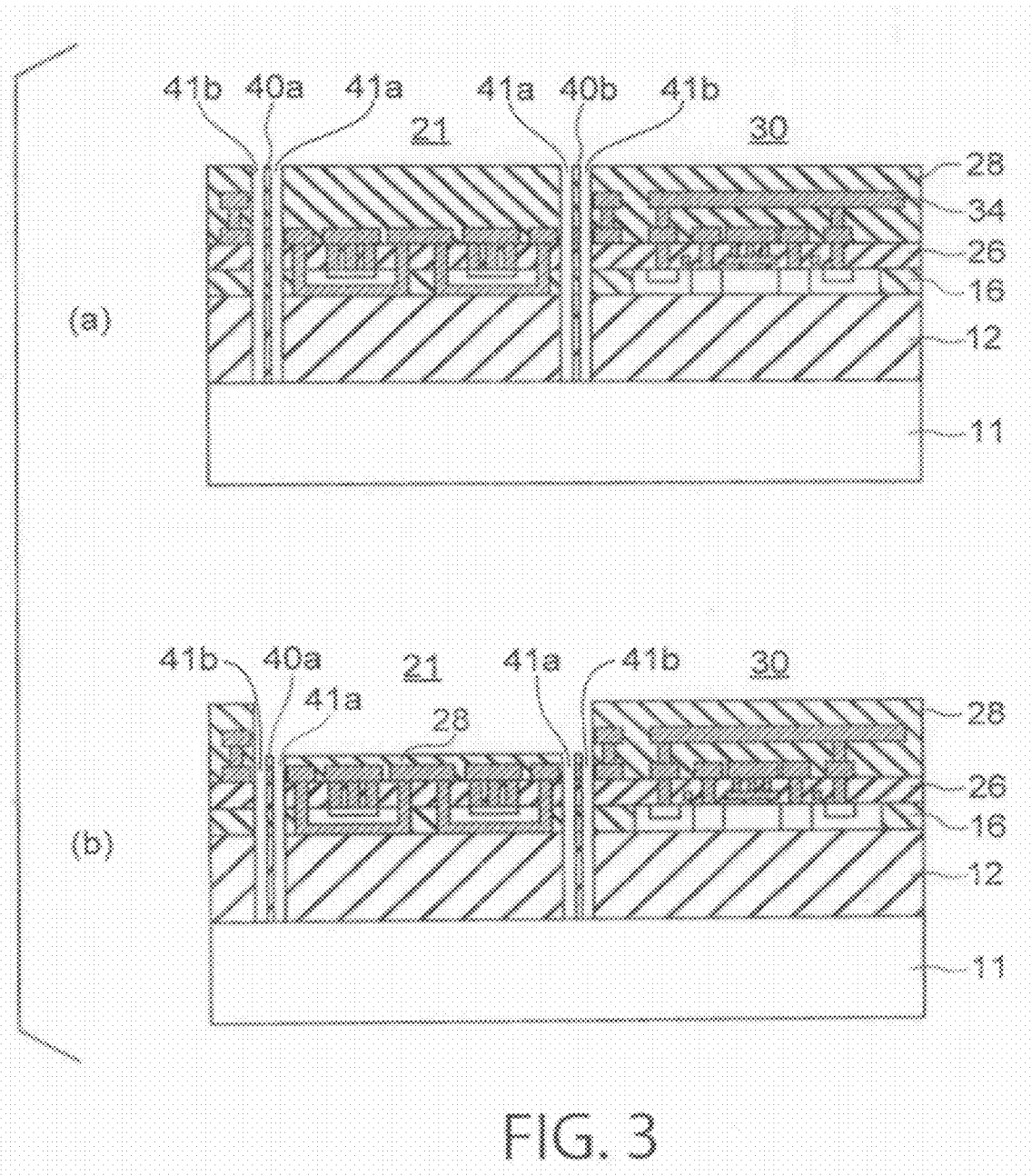
FIGS. 3(a) to 3(b) are sectional views showing a manufacturing process of the infrared imaging element according to the first embodiment.
Figure 4:
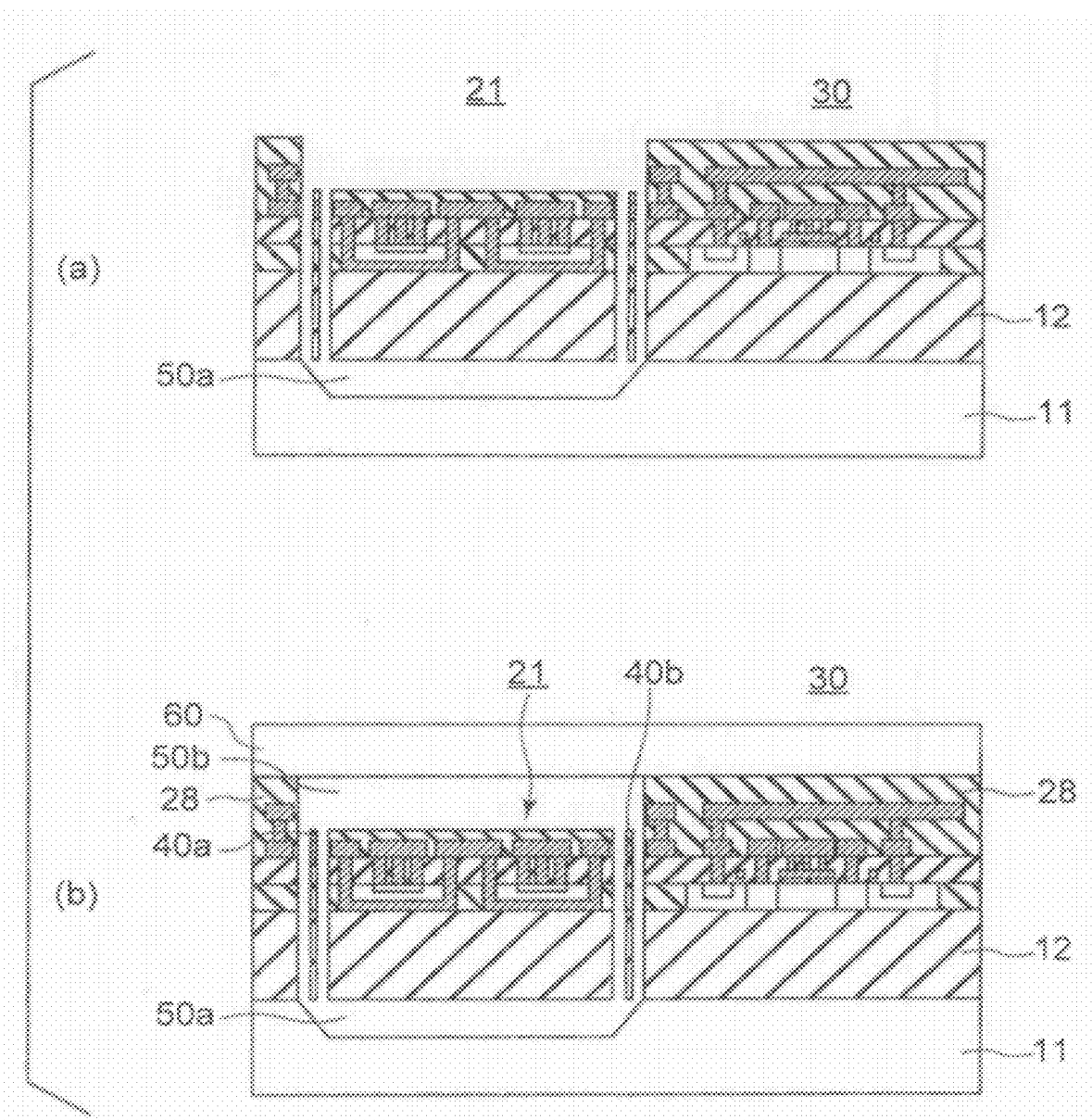
FIGS. 4(a) to 4(b) are sectional views showing a manufacturing process of the infrared imaging element according to the first embodiment.
Figure 5:
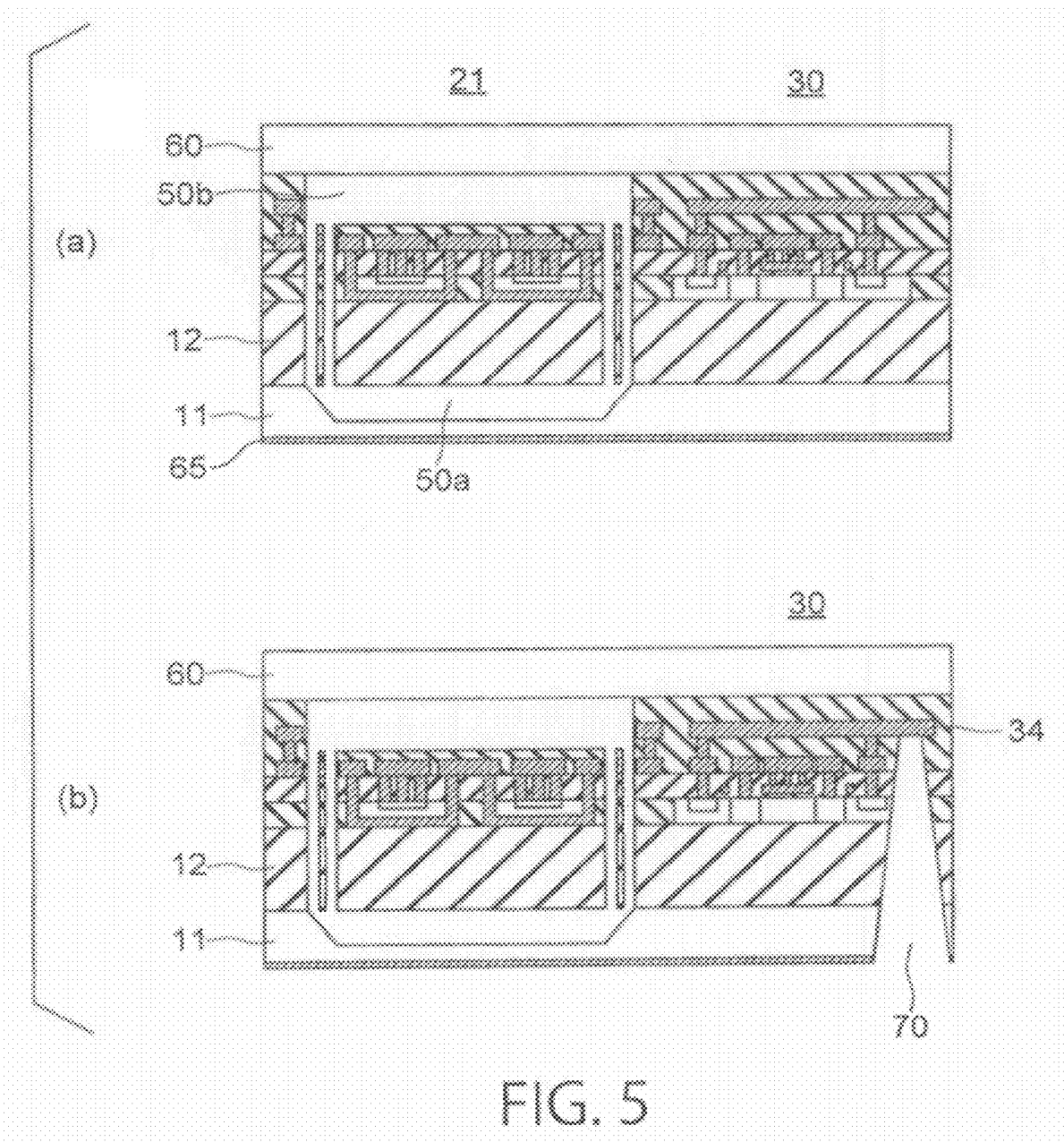
FIGS. 5(a) to 5(b) are sectional views showing a manufacturing process of the infrared imaging element according to the first embodiment.

An infrared imaging element according to an embodiment includes: a semiconductor substrate including a stacked structure of a silicon first substrate, a first insulation film, and a silicon layer stacked in the cited order, a plurality of first cavities being provided on a surface of the first substrate on a side of the first insulation film; an infrared detection unit provided in the semiconductor substrate to detect incident infrared rays, the infrared detection unit including, a plurality of detection cells provided respectively over the plurality of first cavities to detect the incident infrared rays, each of the detection cells having diodes provided in the silicon layer and a second insulation film which covers the diodes, the first insulation film on the first cavity absorbing the incident infrared rays and converting the incident infrared rays to heat, the diodes converting the heat obtained by the first insulation film to an electric signal, a first support structure unit provided to correspond to each of the detection cells to support the detection cell over the first cavity corresponding thereto, the first support structure unit having a first connection wiring connected to a selection line to select the detection cell corresponding thereto, and a second support structure unit provided to correspond to each of the detection cells to support the detection cell over the first cavity corresponding thereto, the second support structure unit having a second connection wiring connected to a signal line to transfer an electric signal from the detection cell corresponding thereto; a circuit unit provided in an area of the semiconductor substrate which differs from an area where the infrared detection unit is formed, the circuit unit including a drive circuit which drives the selection line, a signal processing circuit which process the electric signal sent via the signal line, and a third insulation film covering the drive circuit and the signal processing circuit and having a top face located at a greater distance from the semiconductor substrate as compared with a top face of the second insulation film; and a second substrate provided over the third insulation film to cover the infrared detection unit. A second cavity is formed between the second substrate and the infrared detection unit.

Hereafter, embodiments will be described with reference to the drawings. In the drawings, the same or similar parts are denoted by the same or similar reference characters. However, it should be noted that the drawings are schematic and relations between thickness and plane dimensions and ratios in thickness among respective layers differ from those in actuality. Therefore, concrete thickness and dimensions should be judged in consideration of the ensuing description. Furthermore, it is a matter of course that parts which are different in mutual dimension relation and ratio are included between the drawings as well.

First Embodiment

An infrared imaging element according to a first embodiment is shown in FIG. 1. The infrared imaging element according to the embodiment is formed on a SOI (Silicon On Insulator) substrate. The infrared imaging element includes an infrared detection unit 20 and a peripheral circuit 30. The SOI substrate includes a Si support substrate 11, a buried oxide (BOX) layer 12, and a SOI layer made of silicon single crystal.

The infrared detection unit 20 includes at least one detection cell 21. The detection cell 21 includes plural pn junction diodes (hereafter referred to as diodes as well) 22a and 22b, wirings 24a and 24b which connect these diodes 22a and 22b to the external, and interlayer insulation films 26 and 28 which cover these diodes 22a and 22b and the wirings 24a and 24b. The diodes 22a and 22b in the detection cell 21 are formed in the SOI layer in the SOI substrate. The diodes 22a and 22b are isolated from each other by a STI (Shallow Trench Isolation) 16.

The peripheral circuit 30 includes a drive circuit which drives the diodes 22a and 22b in the detection cell 21, a signal processing circuit which performs processing on a detected signal which is output form the diodes 22a and 22b, wirings 32 and 34 which connect these circuits. The wiring 32 is used to electrically connect elements to each other, and the wiring 34 is used to output a signal to the external. Each of the drive circuit and the signal processing circuit includes plural elements (such as, for example, transistors). These elements are formed in the SOI layer in the SOI substrate, and isolated by the STI 16. Furthermore, the drive circuit, the signal processing circuit, and the wirings 32 and 34 included in the peripheral circuit 30 are covered by the interlayer insulation films 26 and 28 in the same way as the diodes 22a and 22b in the detection cell 21.

A concave portion (cavity) 50a is provided on a surface of the support substrate 11 located right under the detection cell 21. And the detection cell 21 is supported over the concave portion 50a by support structure units 40a and 40b. The support structure units 40a and 40b have wirings, respectively. The wiring of the support structure unit 40a is connected at its first end to the wiring 24a in the detection cell 21, and connected at its second end to one of a selection line for selecting the detection cell 21 and a signal line (not illustrated). The wiring of the support structure unit 40b is connected at its first end to the wiring 24b in the detection cell 21, and connected at its second end to the other of the selection line for selecting the detection cell 21 and the signal line. The selection line is driven by the drive circuit in the peripheral circuit 30. A signal supplied from the signal line is processed by the signal processing circuit and output to the external.

A seal substrate 60 is provided over the detection cell 21 and the peripheral circuit 30. And a top face of the interlayer insulation film 28 for the detection cell 21 and the support structure units 40a and 40b becomes lower than a top face of the interlayer insulation film 28 for the peripheral circuit 30. In other words, the top face interlayer insulation film 28 for the detection cell 21 and the support structure units 40a and 40b is provided to become nearer the buried oxide layer 12. Therefore, a cavity 50b is provided between the detection cell 21 and the support structure units 40a and 40b, and the seal substrate 60. By the way, the seal substrate 60 is joined directly to the top face of the interlayer insulation film 28 for the peripheral circuit 30. Furthermore, an anti-reflective film 65 is formed on a face of the support substrate 11 opposite from the infrared detection unit 20. An opening 70 extending from a side on which the anti-reflective film 65 is provided, to the wiring 34 in the peripheral circuit 30 is provided. An external leading wiring 72 electrically connected to the wiring 34 is provided in the opening 70.

A direction in which infrared rays are absorbed will now be described. In the conventional infrared sensor, a detection cell which detects infrared rays is formed on a semiconductor substrate made of silicon, and a seal plate acting as an infrared transmission window is connected to a top portion of the detection cell. Although the detection cell is formed in the silicon substrate, an infrared absorption film is formed on the detection cell to transfer a thermoelectric conversion signal to a desired circuit. Therefore, infrared rays are absorbed by an interlayer insulation film functioning as an infrared absorption film via the seal plate (infrared transmission window) provided on a package which covers the detection cell, and thermoelectric conversion is performed in the semiconductor substrate located right under the interlayer insulation film.

On the other hand, in the present embodiment, infrared rays are absorbed by the buried oxide layer 12 located under the SOI layer in which the pn junction diodes 22a and 22b are formed. In addition, the silicon support substrate 11 is made to function as an infrared transmission window via the cavity 50a. In other words, the conventional infrared imaging element detects infrared rays from the top face, whereas the present embodiment has a configuration which detects infrared energy from a bottom face (rear face) of the infrared cell.

The infrared imaging element according to the present embodiment is formed on the SOI substrate and the silicon support substrate 11 can be made to function as the infrared transmission window as described above. Therefore, joining of the window member used in the conventional infrared sensor becomes unnecessary. In addition, since the buried oxide layer 12 is utilized as the infrared absorption film, the infrared absorption efficiency per the same area can be improved. In the conventional configuration, the interlayer insulation film formed in the detection cell which is formed on the semiconductor substrate is used as the infrared absorption film. A wiring layer for coupling a thermoelectric conversion signal to a desired circuit is provided in the infrared absorption film. Considering the general-purpose CMOS process, Al or the like is typically used as this wiring layer and it has a property of reflecting infrared rays. In other words, since the wiring layer functions as the reflection layer, infrared rays radiated into this area cannot be detected. On the other hand, in the present embodiment, the buried oxide layer 12 is used as the infrared absorption film and there aren't members which prevent incidence of infrared rays at all in the buried oxide layer 12. Therefore, it becomes possible to improve the infrared absorption efficiency with respect to the same cell area.

By the way, in the infrared imaging element according to the present embodiment, the cavity 50b is provided on a top portion of the infrared detection unit 20 as well. Since it is necessary to keep the cavity 50b vacuum, the seal substrate 60 is provided to seal the cavity 50b. This seal substrate 60 is joined directly to the interlayer insulation film 28 in the peripheral circuit 30. Furthermore, in the present embodiment, the support substrate 11 is used as the infrared transmission window as described above. Therefore, it suffices that the seal substrate 60 has only a function of sealing the cavity 50b. Therefore, the seal substrate 60 is not restricted to the silicon substrate, but a quartz substrate or the like can be selected. In this way, it becomes possible to use an inexpensive material. As a result, the cost can be further lowered.

Furthermore, for connection to the external, the leading wiring 72 is pulled out from the rear face side of the support substrate 11. As a result, it can be avoided to connect the support substrate 11 to the seal substrate 60 by thermal melting with solder and a joining process at the room temperature becomes possible. Especially in the case of solder joining, a wax material is contained within solder. Therefore, there is a fear that output gas will occur at the time of thermal melting. The output gas aggravates the vacuum atmosphere of the cavities 50a and 50b, and causes the sensitivity lowering. It is known that prebaking at a high temperature is effective for flowing out the output gas before sealing. However, there is a fear that a CMOS area where transistors in the peripheral circuit 30 are formed, especially a wiring portion in the CMOS area, or the MEMS structure (the detection cell and the support structure unit) in the infrared detection unit 20 will be subjected to thermal stress at the time of high temperature processing, resulting in enormous performance lowering. According to the present embodiment, however, the problem of the thermal stress can also be avoided by performing direct bonding portion at the room temperature without using solder bumps as the joining member.

A manufacturing method of the infrared imaging element according to the present embodiment will now be described with reference to FIG. 2(a) to FIG. 5(b). The infrared imaging element according to the present embodiment is formed by using the general-purpose CMOS process.

First, a SOI substrate including the support substrate 11, the buried oxide layer 12, and the SOI layer 13 is prepared (FIG. 2(a)). Since the buried oxide layer 12 functions as the infrared absorption film as described above, it is desirable that the buried oxide layer 12 has a film thickness of at least 1 μm.

Then, the diodes 22a and 22b which perform thermoelectric conversion at the time of infrared irradiation are formed in the SOI layer by using the well-known technique (FIG. 2(b)). At this time, the elements in the peripheral circuit 30 and the signal processing circuit are formed in the SOI layer simultaneously by using the well-known technique. The elements in the peripheral circuit 30 form the drive circuit which drives the diodes 22a and 22b, and the signal processing circuit processes signals supplied from the diodes 22a and 22b. Element isolation between the diodes 22a and 22b and element isolation for elements which form the peripheral circuit are performed by using, for example, the STI 16.

Then, as shown in FIG. 2(c), the interlayer insulation film 26 which covers the diodes 22a and 22b and the elements of the peripheral circuit 30 is formed, and a first contact connected to the diodes 22a and 22b and the elements of the peripheral circuit 30 is formed in the interlayer insulation film 26. Thereafter, the wirings 24a, 24b and 32 connected to the first contact are formed on the interlayer insulation film 26. A first interlayer insulation film which covers these wirings 24a, 24b and 32 is formed on the interlayer insulation film 26. Subsequently, a second contact connected to the wirings 24a, 24b and 32 is formed in the first interlayer insulation film. Thereafter, the wiring 34 connected to the second contact is formed on the first interlayer insulation film. And a second interlayer insulation film which covers the wiring 34 is formed on the first interlayer insulation film. The first interlayer insulation film and the second interlayer insulation film become the interlayer insulation film 28. By the way, the interlayer insulation films 26 and 28 may be formed by using TEOS (Tetra Ethyl Ortho Silicata) or the like.

Then, etching is performed by using dry etching such as RIE (Reactive Ion Etching) and thereby deep openings 41a and 41b are formed (FIG. 3(a)). At this time, the detection cell 21 and the peripheral circuit 30 which are not subject to the etching are protected by a mask such as a photoresist. The openings 41a isolate the support structure units 40a and 40b from the detection cell 21, and the openings 41b isolate the support structure units 40a and 40b from the peripheral circuit 30. These openings 41a and 41b are made to have a depth to pass through the buried oxide layer 12 and reach the surface of the support substrate 11 (FIG. 3(a)).

Then, only the interlayer insulation film 28 for the detection cell 21 and the support structure units 40a and 40b is etched back by using dry etching (FIG. 3(a)). As a result, the top face of the interlayer insulation film 28 for the detection cell 21 and the support structure units 40a and 40b becomes lower than the top face of the interlayer insulation film 28 for the peripheral circuit 30. In other words, the top face of the interlayer insulation film 28 for the detection cell 21 and the support structure units 40a and 40b is formed to become nearer the buried oxide layer 12 (FIG. 3(b)).

Then, the support substrate 11 located under the detection cell 21 is etched via the openings 41a and 41b, and a concave portion (cavity) 50a communicating with the openings 41a and 41b is formed at the surface of the support substrate 11 located under the detection cell 21 (FIG. 4(a)). As for this etching, isotropic dry etching using $XeF_2$ gas can be used besides anisotropic etching using a KOH or TMAH solution. It becomes possible to implement thermal isolation by forming the cavity 50a and thereby isolating the detection cell 21 from the substrate 11.

Then, as shown in FIG. 4(b), the seal substrate 60 is formed on the interlayer insulation film 28 for the peripheral circuit 30 by joining to form the cavity 50b between the seal substrate 60 and the detection cell 21. It is desirable to conduct joining at the room temperature, and a direct bonding method based on activation of the joining face can be used. In this method, it is possible to remove a joining hamper layer on the surface of a wafer and directly bond dangling-bonds of atoms on the surface by applying for example, an Ar beam to the interlayer insulation film 28 and the seal substrate 60. As a result, firm joining is made possible. At the time of joining, the inside of the chamber is kept in the high vacuum state. At the time of joining, therefore, the inside of the infrared imaging element is kept in the vacuum state at the same time. In joining, a substance causing output gas, such as an organic matter, does not exist on the surface of the infrared imaging element at all. As a result, stable vacuum sealing becomes possible. As the seal substrate 60 for joining, a single crystal silicon substrate, a quartz substrate, or the like can be used. For improving the joining property of the seal substrate 60, it is desirable to enhance the flatness of the interlayer insulation film 28. It is desirable to conduct planarization processing on the surface of, for example, a topmost layer of the interlayer insulation film 28 by using, for example, CMP (Chemical Mechanical Polishing) or the like. In the same way, as for the seal substrate 60 used for joining as well, it is desirable to use a substrate having flatness secured on its surface. As shown in FIG. 3(b), the interlayer insulation film 28 on the detection cell 21 is etched back. After the seal substrate 60 is joined, therefore, the cavity 50b is formed only over the detection cell 21 and the support structure units 40a and 40b. As a result, thermal isolation becomes possible.

Figure 14:
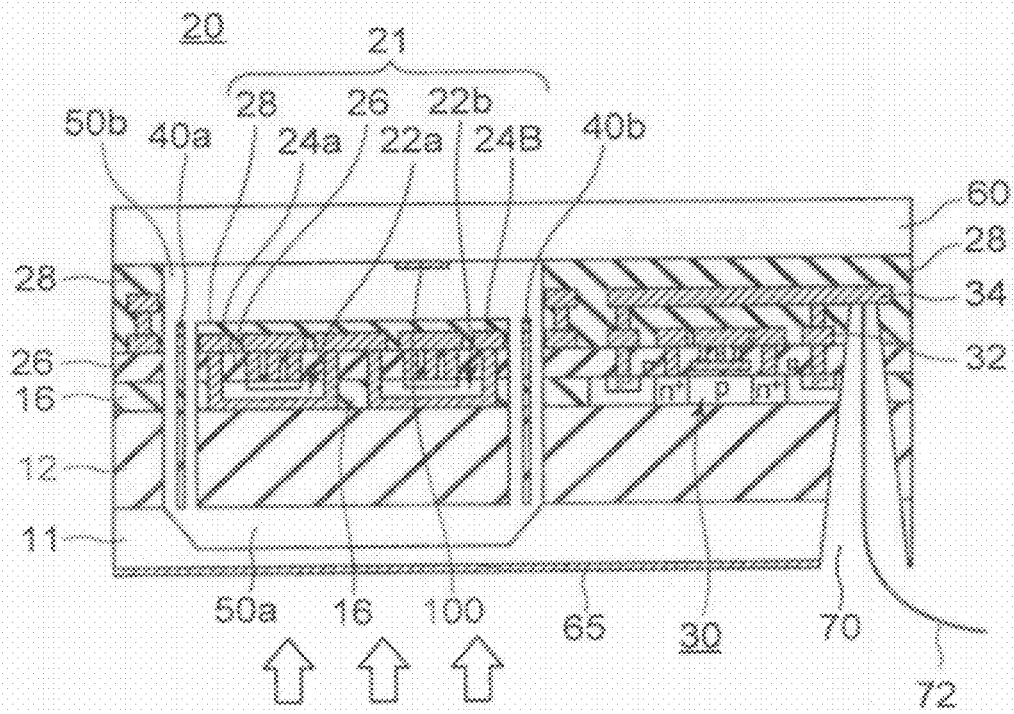
FIG. 14 is a sectional view showing an infrared imaging element according to a modification of an embodiment.

Then, as shown in FIG. 5(a), the support substrate 11 is made thin, and then the anti-reflective film 65 is joined to the face of the support substrate 11 opposite from the detection cell 21. As described above, the support substrate 11 is made to function as the infrared transmission window. Single crystal silicon has a high infrared absorption coefficient. If the thickness of the support substrate 11 is thick, then the attenuation of infrared energy arriving at the diode occurs although it is slight. Therefore, it becomes effective to make the support substrate 11 functioning as the infrared transmission window thin from the viewpoint of the efficiency. It is possible to contribute to the improvement of the transmission efficiency by making the thickness of the support substrate 11 thin. The CMP or substrate density difference selective etching can be applied to thinning the support substrate 11 functioning as the infrared transmission window, and the thickness of the support substrate 11 can be controlled in the range of 600 μm to 10 μm. Furthermore, DLC (Diamond Like Carton) or the like can be used as the anti-reflective film 65. Furthermore, it is also possible to form a getter 100 on the seal substrate 60 as shown in FIG. 14 in order to maintain the vacuum degree in the sensor with time.

Then, the opening 70 which extends from the anti-reflective film 65 to the wiring 34 to form the leading wiring 72 shown in FIG. 1 is formed (FIG. 5(b)). This opening 70 is formed by performing lithography with respect to the wiring 34 with an aligner or the like and performing dry etching. Thereafter, the leading wiring 72 connected to the wiring 34 located at a bottom portion of the opening 70 is formed, and the infrared imaging element is completed. This leading wiring 72 is formed by locating the infrared imaging element upside down to make the seal substrate 60 the bottom, and performing electrical connection of the opening 70 to an external interface with wire bonding or the like.

In the infrared imaging element manufactured in this way, the support substrate 11 is made to function as the infrared transmission window. As a result, the infrared transmission and absorption efficiency can be improved, and it becomes possible to freely select the material of the seal substrate 60 and implement a stable vacuum seal process in a room temperature process.

According to the infrared imaging element in the present embodiment, therefore, the manufacturing cost can be reduced as much as possible and it is possible to prevent from being subjected to great thermal stress at the time of manufacturing as far as possible.

Second Embodiment

Figure 6:
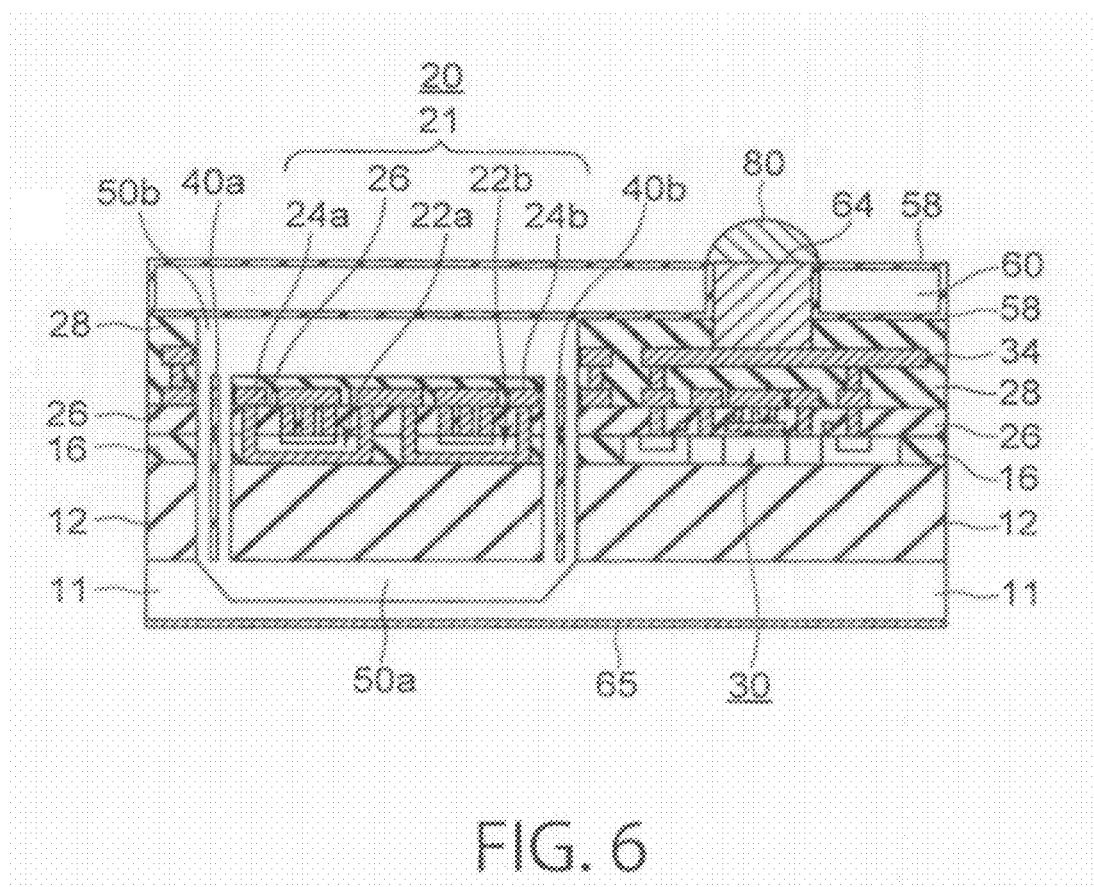
FIG. 6 is a sectional view showing an infrared imaging element according to a second embodiment.
Figure 7:
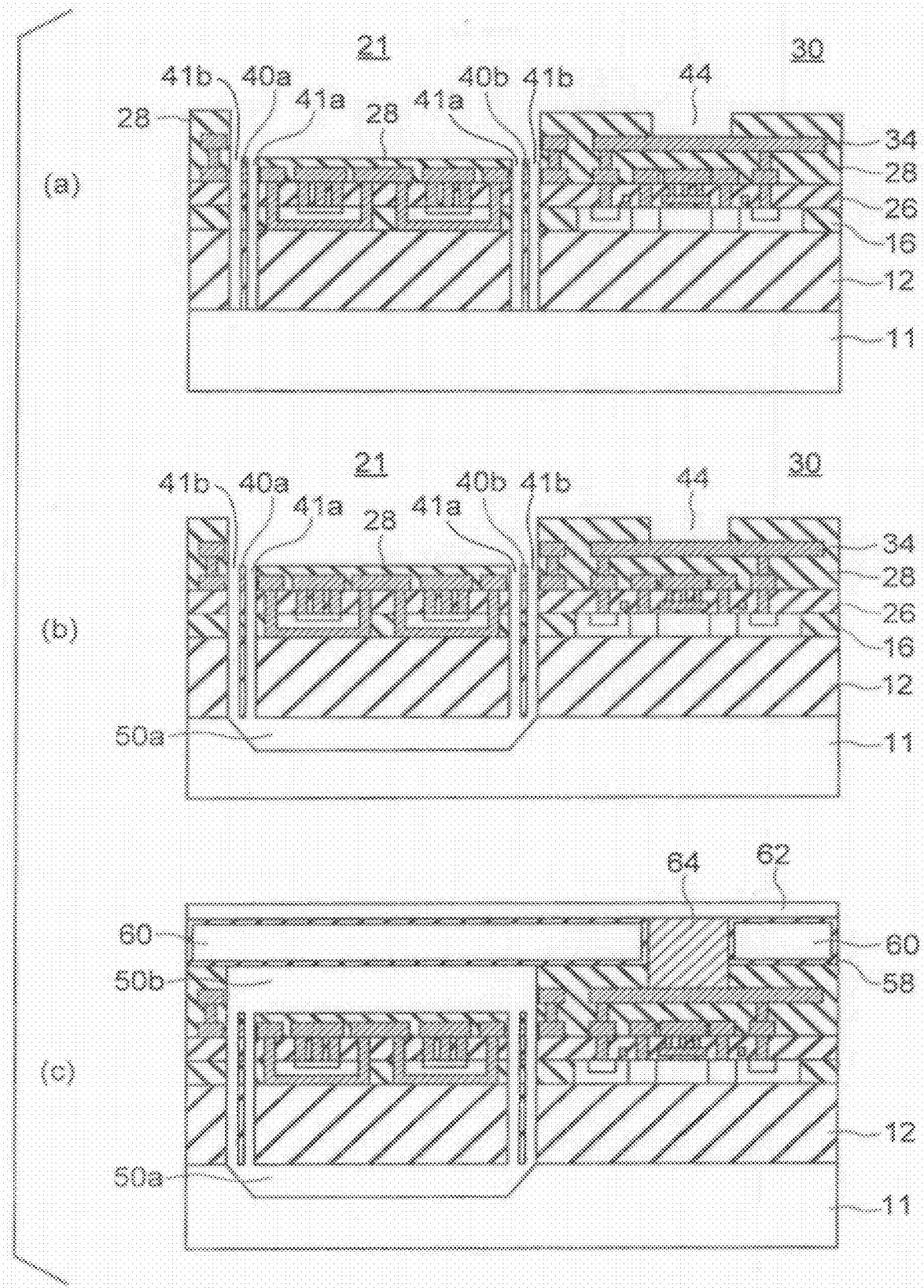
FIGS. 7(a) to 7(c) are sectional views showing a manufacturing process of the infrared imaging element according to the second embodiment.
Figure 8:
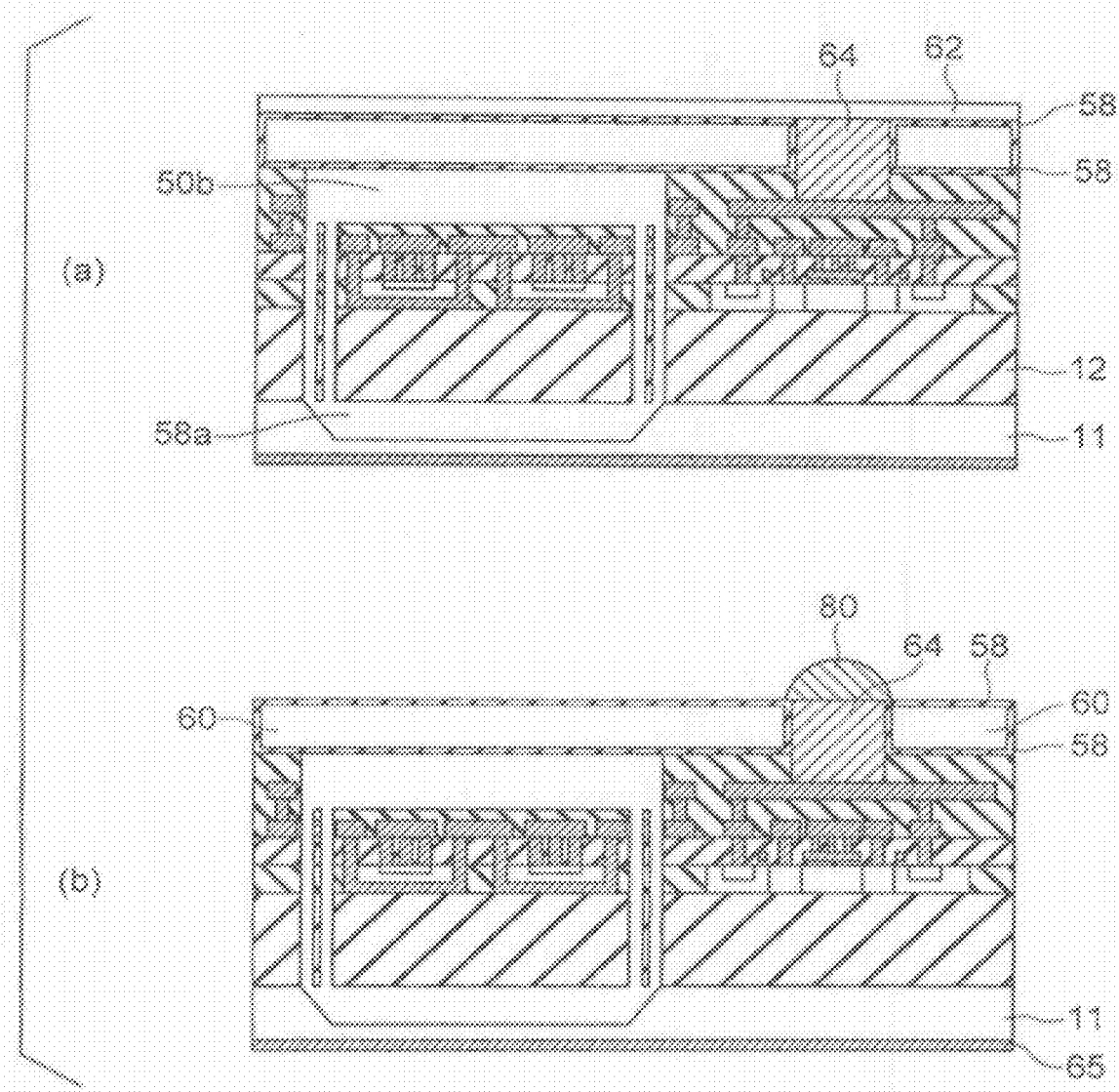
FIGS. 8(a) to 8(b) are sectional views showing a manufacturing process of the infrared imaging element according to the second embodiment.

An infrared imaging element according to a second embodiment is shown in FIG. 6. The infrared imaging element according to the first embodiment shown in FIG. 1 has a structure in which the leading wiring 72 for electrical connection to the external is taken out from the infrared incidence side. The infrared imaging element according to the second embodiment has a configuration in which a connection electrode 80 for connection to the external is provided on the seal substrate 60 side. The connection electrode 80 is electrically connected to the wiring 34 in the peripheral circuit 30 via a through electrode (through via) 64 provided in the seal substrate 60. In the present embodiment, a conductive substrate such as a silicon substrate is used as the seal substrate 60. Therefore, an insulation film 58 is formed between the seal substrate 60 and the interlayer insulation film 28 in the peripheral circuit 30, between the through electrode 64 and the seal substrate 60, and on the top face of the seal substrate 60. If an insulative substrate is used as the seal substrate 60, the insulation film 58 becomes unnecessary.

A manufacturing method of the infrared imaging element according to the present embodiment will now be described with reference to FIGS. 7(a) to 8(b). A process similar to that in the first embodiment is used until the process shown in FIG. 3(a) is executed, that is, until the openings 41a which isolate the detection cell 21 from the support structure units 40a and 40b and the openings 41b which isolate the peripheral circuit 30 from the support structure units 40a and 40b are formed.

Then, the top face of the interlayer insulation film 28 for the detection cell 21 and the support structure units 40a and 40b is etched back as shown in FIG. 7(a). In addition, an opening 44 which communicates with the wiring 34 in the peripheral circuit 30 is formed in the interlayer insulation film 28 in the peripheral circuit 30.

Then, the support substrate 11 under the detection cell 21 is etched via the openings 41a and 41b to form a concave portion (cavity) 50a communicating with the openings 41a and 41b at the surface of the support substrate 11 located right under the detection cell 21 in the same way as the first embodiment (FIG. 7(b)).

Then, the seal substrate 60 having the insulation film 58 over its entire face and having a through-hole which is to communicate with the wiring 34 is joined to the interlayer insulation film 28 for the peripheral circuit 30 by direct bonding. At this time, alignment is taken between the through-hole of the seal substrate 60 and the opening 44 in the interlayer insulation film 28. The cavity 50b is formed between the detection cell 21 and the support structure units 40a and 40b, and the seal substrate 60 by the joining. Subsequently, the through-electrode 64 is formed to bury the through-hole and the opening. Then, a protection film 62 which covers the seal substrate 60 and the through-electrode 64 is formed (FIG. 7(c)).

Then, the anti-reflective film 65 is formed on the rear face of the support substrate 11 as shown in FIG. 8(a). Subsequently, the protection film 62 is peeled off, and the connection electrode 80 which becomes a solder bump electrically connected to the through-electrode 64 is formed. The infrared imaging element is completed.

The infrared imaging element after completion is located upside down to make the seal substrate side the bottom, mounted on an arbitrary substrate, and electrically connected by reflow or the like.

The process of wire bonding can be omitted by using the surface mounting type as in the present embodiment as described above. In addition, it is possible to lower the height of the sensor system and provide a compact camera system.

The infrared imaging element according to the present embodiment can also lower the manufacturing cost as much as possible in the same way as the first embodiment. In addition, it is possible to prevent the infrared imaging element from being subjected to great thermal stress as far as possible at the time of manufacturing.

Figure 9:
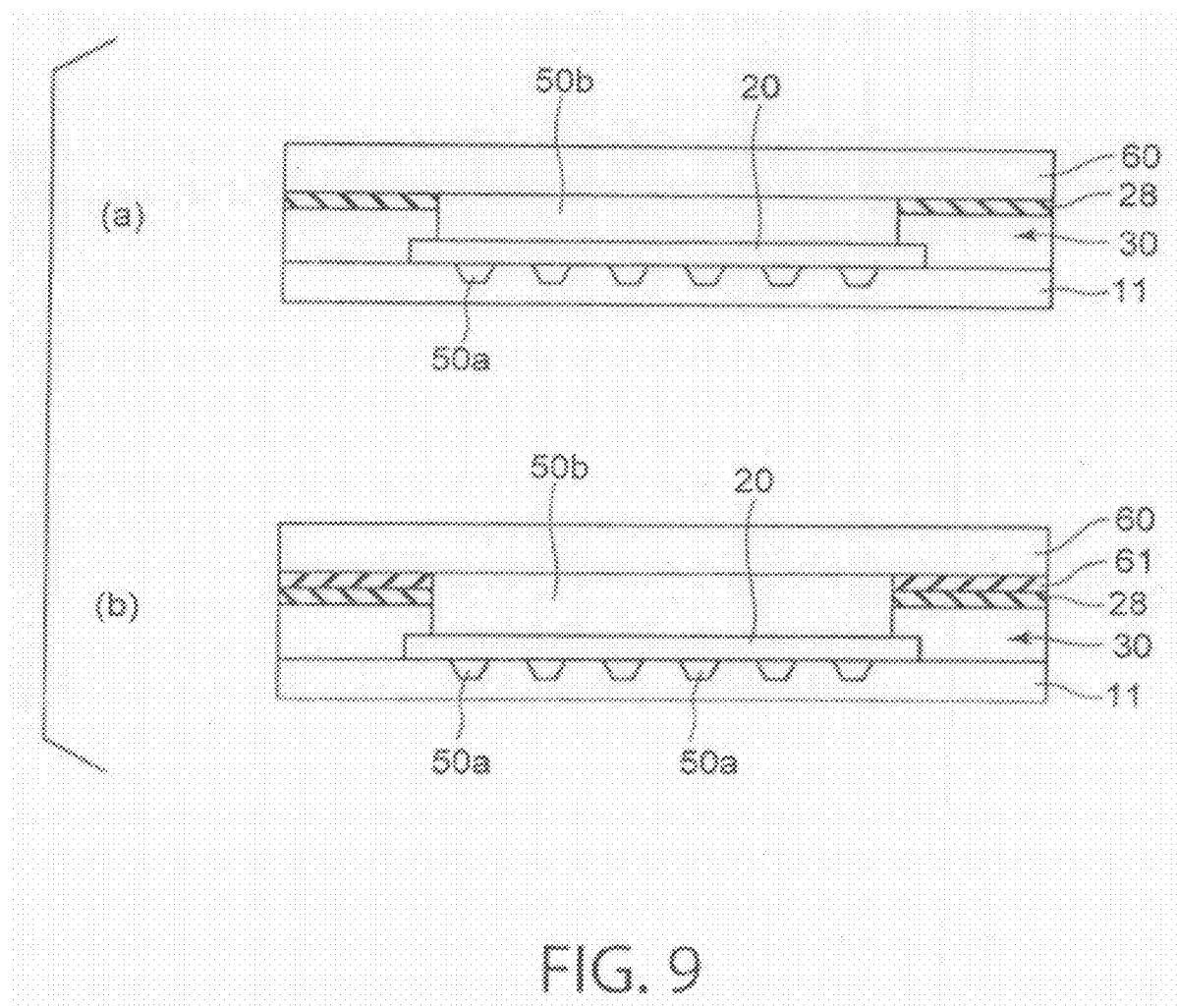
FIG. 9(a) is a diagram for explaining an example of joining of a seal substrate.
FIG. 9(b) is a diagram for explaining another example of joining of the seal substrate.

As for joining the seal substrate 60 and the interlayer insulation film 28 covering the peripheral circuit 30 together, they can be stuck together in a vacuum atmosphere as shown in FIG. 9(a) in the first and second embodiments. This can be implemented by using a direct bonding technique which makes possible the joining at low temperatures. The direct bonding is known as a technique which forms firm joining by applying for example, an Ar beam to the seal substrate 60 and the interlayer insulation film 28 covering the peripheral circuit, thereby removing the joining hamper layer on the surface, and directly bond dangling-bonds of atoms on the surface.

On the other hand, it is also possible to form a bonding layer 61 on the interlayer insulation film 28 which covers the peripheral circuit and stick the interlayer insulation film 28 and the seal substrate 60 together by the bonding layer 61 as shown in FIG. 9(b). Recently, bonding agents or the like for vacuum application suppressed in output gas are also put on the market, and direct bonding using them can also be adopted. When joining the interlayer insulation film 28 covering the peripheral circuit 30 and the seal substrate 60 together, a joining area is previously patterned to the interlayer insulation film 28 or the seal substrate 60 by using the lithography or the like. At the time of joining, the interlayer insulation film 28 covering the peripheral circuit 30 and the seal substrate 60 can be stuck together by causing them to be opposed to each other in the vacuum atmosphere, performing output gas processing, and then heating and pressurizing them. Although the infrared detection unit 20 includes plural detection cells, support structure units which support the detection cells, and a wiring unit including a selection line to select a detection cell and a signal line to transfer a signal from the detection cells, they are omitted in FIGS. 9(a) and 9(b). A cavity 50a is provided under each detection cell. A cavity 50b is formed to become common to all detection cells. Furthermore, openings communicating with the cavities 50a and 50b are omitted between the detection cell and the support structure units.

Third Embodiment

Figure 10:
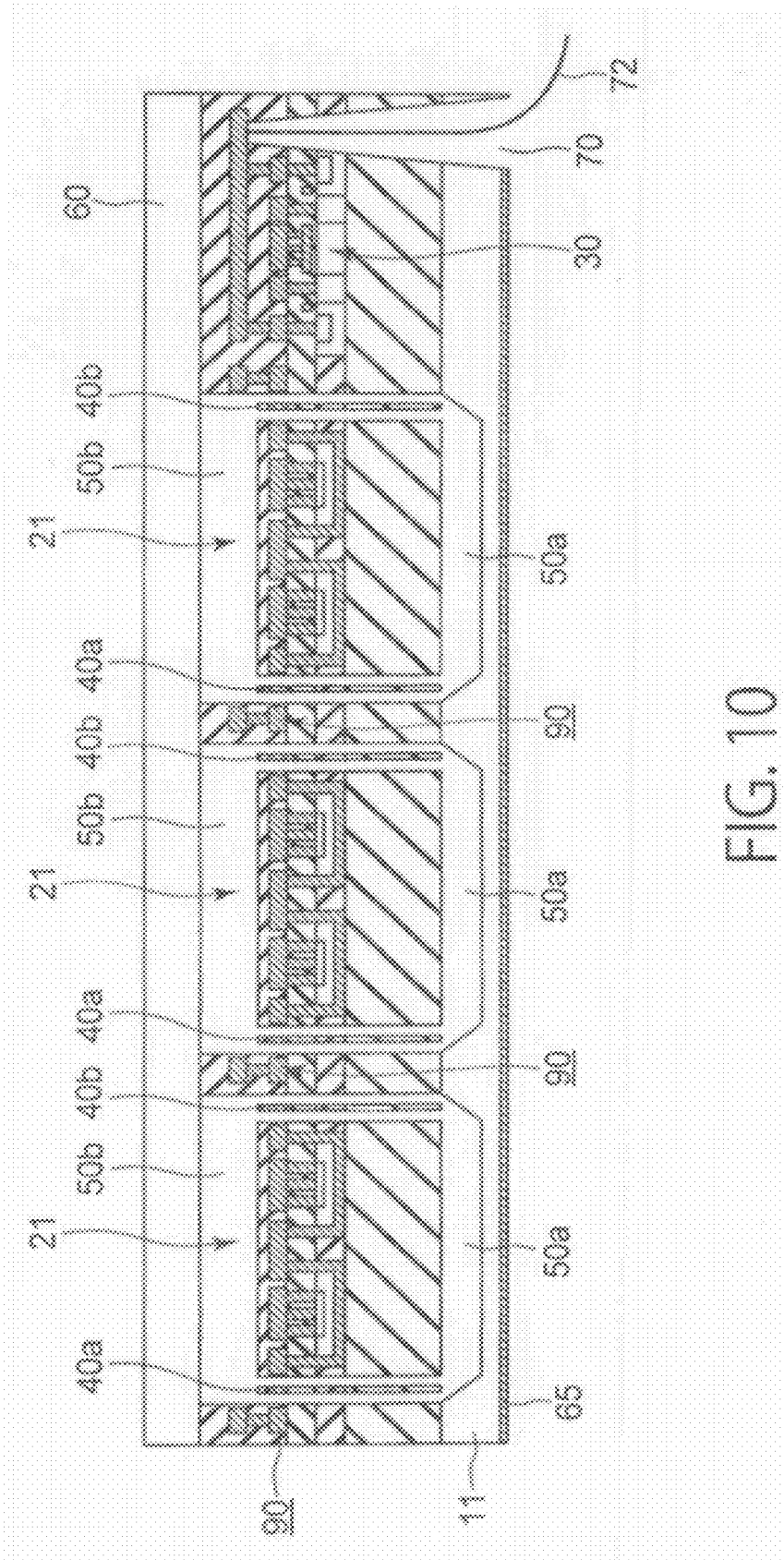
FIG. 10 is a sectional view showing an infrared imaging element according to a third embodiment.

An infrared imaging element according to a third embodiment is shown in FIG. 10. The infrared imaging element according to this embodiment has the same configuration as that in the first embodiment except that the cavity 50a and the cavity 50b are provided for each of plural detection cells 21 arranged in a matrix form. The present embodiment has a configuration in which the detection cell 21, the support structure units 40a and 40b which support the detection cell 21, and the cavities 50a and 50b are isolated by a wiring unit 90 including a signal line or a selection line. As a result, thermal isolation every detection cell 21 becomes possible.

When a high temperature subject is imaged in the case where the infrared imaging element has a configuration in which the cavity 50b becomes common to the plural detection cells 21 as shown in FIGS. 9(a) and 9(b), there is a possibility that a heat component will be brought to an area other than the high temperature detection cells and the whole area of the sensor will fall into the saturation state, because the space over the sensor is thermally linked. On the other hand, in the configuration in the present embodiment, each detection cell 21 has an individual cavity as shown in FIG. 10. Therefore, it becomes possible to thermally isolate from adjacent pixels (detection cells). Even if a high temperature subject exists in an arbitrary pixel, therefore, the above described problem can be avoided because the detection cells are thermally isolated as described above. In other words, the heat capacity can be made small and it becomes possible to reduce the thermal time constant.

In the present embodiment as well, the manufacturing cost can be reduced as much as possible and it is possible to prevent from being subjected to great thermal stress at the time of manufacturing as far as possible, in the same way as the first embodiment.

By the way, the third embodiment may be applied to the second embodiment.

Fourth Embodiment

Figure 11:
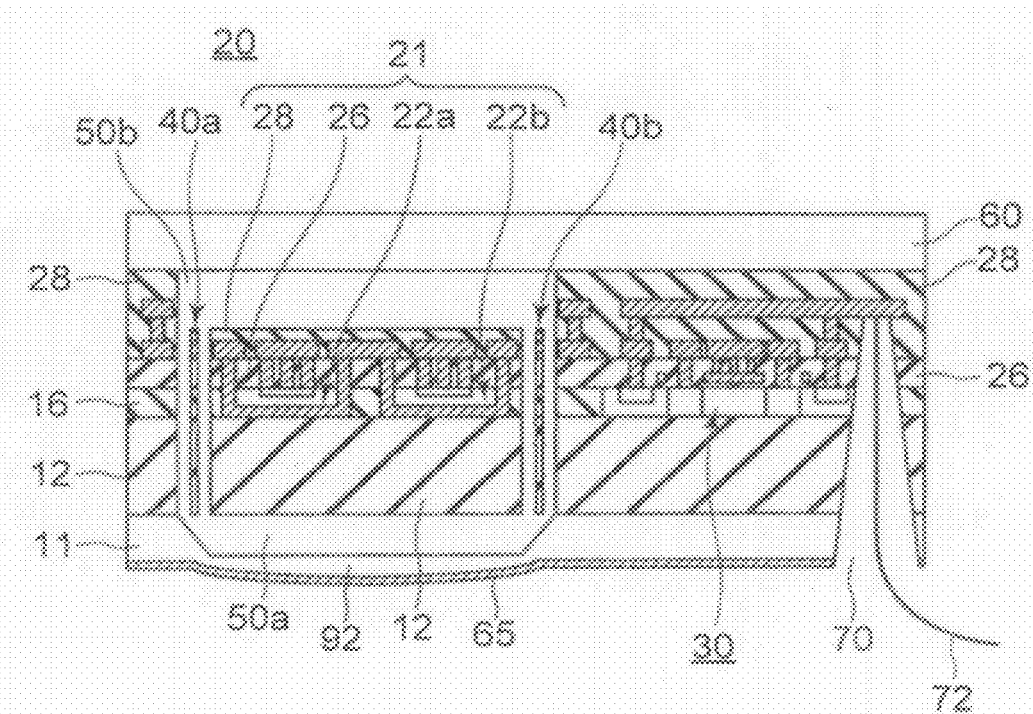
FIG. 11 is a sectional view showing an infrared imaging element according to a fourth embodiment.

An infrared imaging element according to a fourth embodiment is shown in FIG. 11. The infrared imaging element according to this embodiment has a configuration obtained from the infrared imaging element according to the first embodiment shown in FIG. 1 by providing a microlens 92 on the bottom of the cavity 50a with respect to the detection cell 21. This microlens can be formed by performing lithography and dry etching on the infrared transmission window formed of the silicon support substrate 11 from a face opposite from the detection cell 21.

The infrared absorption efficiency can be further improved by providing the microlens 92 in this way.

In the present embodiment as well, the manufacturing cost can be reduced as much as possible and it is possible to prevent from being subjected to great thermal stress at the time of manufacturing as far as possible, in the same way as the first embodiment. By the way, the forth embodiment may be applied to the second embodiment.

Fifth Embodiment

Figure 12:
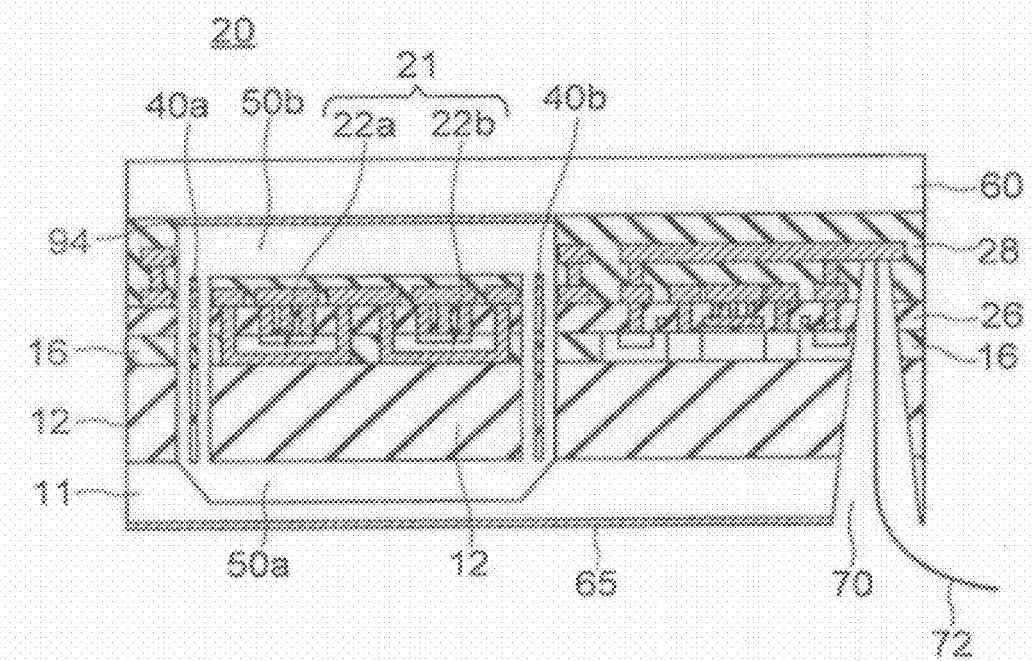
FIG. 12 is a sectional view showing an infrared imaging element according to a fifth embodiment.

An infrared imaging element according to a fifth embodiment is shown in FIG. 12. The infrared imaging element according to this embodiment has a configuration obtained from the infrared imaging element according to the first embodiment shown in FIG. 1 by providing a reflection film 94 on a face of the seal substrate 60 opposed to the detection cell 21. Out of infrared energy brought to the infrared detection unit 20 via the infrared transmission window formed of the silicon support substrate 11, infrared energy which is not absorbed by the diodes 22a and 22b is reflected by the reflection film 94 and taken into the diodes 22a and 22b again. As a result, the efficiency can be improved. Here, metal having a high reflection property, such as Au or Al, can be used as the reflection film. Furthermore, a resonance structure can be formed and a higher infrared absorption efficiency can be obtained by setting the gap thickness of the cavity 50b equal to, for example, one fourth of the infrared wavelength λ to be detected, that is, λ/4.

In the present embodiment as well, the manufacturing cost can be reduced as much as possible and it is possible to prevent from being subjected to great thermal stress at the time of manufacturing as far as possible, in the same way as the first embodiment. By the way, the fifth embodiment may be applied to the second embodiment.

Sixth Embodiment

Figure 13:
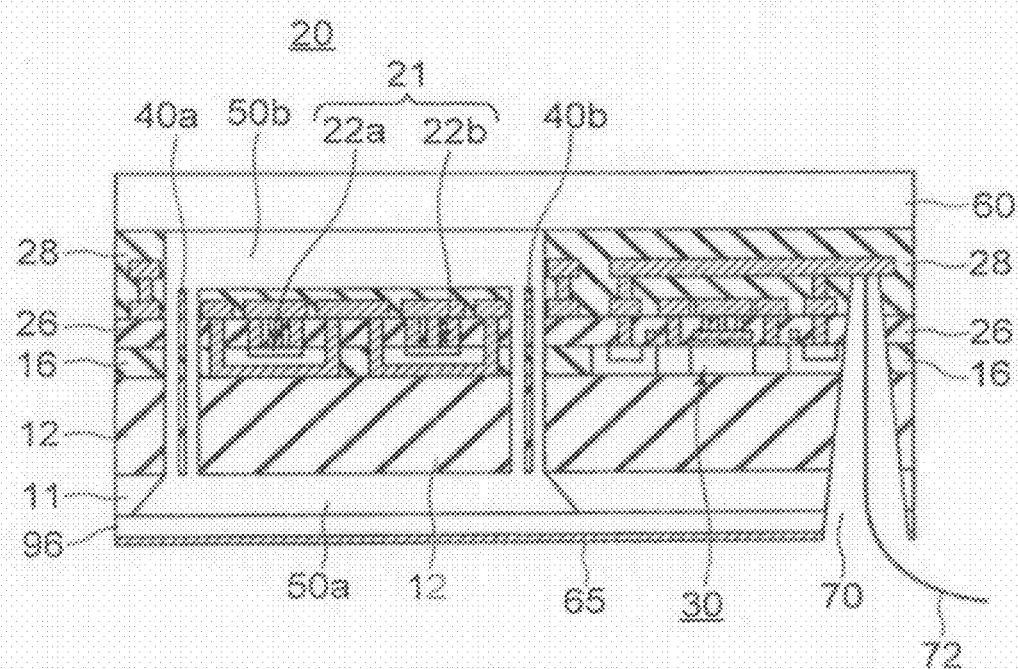
FIG. 13 is a sectional view showing an infrared imaging element according to a sixth embodiment.

An infrared imaging element according to a sixth embodiment is shown in FIG. 13. The infrared imaging element according to this embodiment has a configuration obtained from the infrared imaging element according to the first embodiment shown in FIG. 1 by causing the cavity 50a to pass through the support substrate 11 and have a tapered shape in which the infrared incidence face has a wider area than the buried insulation layer side face and further providing an infrared transmission window 96 which covers the cavity 50a. It is attempted to improve the infrared absorption efficiency by refracting the infrared energy into the direction of the diodes 22a and 22b at the silicon interface having the tapered shape in such a configuration. The opening having the tapered shape is formed by performing lithography to open an area corresponding to the detection cell 21 from a side of the silicon support substrate 11 opposite from the detection cell and performing anisotropic etching of silicon. In this case, the infrared transmission window 96 for implementing the vacuum seal is connected to the bottom of the silicon support substrate 11 having the opening formed, by direct bonding. As a result, the cavity 50a having the tapered shape in which the infrared incidence side has a wider area is formed. And the anti-reflective film 65 is formed on a face of the infrared transmission window 96 opposite from the cavity 50a.

In the present embodiment as well, the manufacturing cost can be reduced as much as possible and it is possible to prevent from being subjected to great thermal stress at the time of manufacturing as far as possible, in the same way as the first embodiment. By the way, the sixth embodiment may be applied to the second embodiment.

An infrared imaging element can be formed by combining at least two out of the fourth to sixth embodiments. In this case, the infrared imaging element can be applied to the second embodiment.

Individual measures for improving the infrared absorption efficiency described above can be combined. Furthermore, in the configuration examples shown in FIGS. 7 to 9, pad opening type infrared sensors are illustrated. As a matter of course, however, the configuration examples shown in FIGS. 7 to 9 may be applied to the structure having the through via wiring shown in FIG. 3.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. An infrared imaging element comprising:
   a semiconductor substrate comprising a stacked structure of a silicon first substrate, a first insulation film, and a silicon layer stacked in the cited order, a plurality of first cavities being provided on a surface of the first substrate on a side of the first insulation film;
   an infrared detection unit provided in the semiconductor substrate to detect incident infrared rays, the infrared detection unit including,
      a plurality of detection cells provided respectively over the plurality of first cavities to detect the incident infrared rays, each of the detection cells having diodes provided in the silicon layer and a second insulation film which covers the diodes, the first insulation film on the first cavity absorbing the incident infrared rays and converting the incident infrared rays to heat, the diodes converting the heat obtained by the first insulation film to an electric signal,
      a first support structure unit provided to correspond to each of the detection cells to support the detection cell over the first cavity corresponding thereto, the first support structure unit having a first connection wiring connected to a selection line to select the detection cell corresponding thereto, and
      a second support structure unit provided to correspond to each of the detection cells to support the detection cell over the first cavity corresponding thereto, the second support structure unit having a second connection wiring connected to a signal line to transfer an electric signal from the detection cell corresponding thereto;
   a circuit unit provided in an area of the semiconductor substrate which differs from an area where the infrared detection unit is formed, the circuit unit including a drive circuit which drives the selection line, a signal processing circuit which process the electric signal sent via the signal line, and a third insulation film covering the drive circuit and the signal processing circuit and having a top face located at a greater distance from the semiconductor substrate as compared with a top face of the second insulation film;
   a second substrate provided over the third insulation film to cover the infrared detection unit; and
   a reflection film provided on a face of the second substrate opposed to the infrared detection unit,
   wherein a second cavity is formed between the second substrate and the infrared detection unit, and with respect to each detection cell, the first substrate located right under the first cavity functions as a transmission window of the incident infrared rays.

2. The element according to claim 1, further comprising an anti-reflective film provided on a face of the first substrate opposite from the first insulation film.

3. The element according to claim 1, wherein the second substrate is joined directly to the third insulation film.

4. The element according to claim 1, wherein the second cavity is provided for each of the detection cells, and the second cavity is spatially isolated by first and second wiring units respectively including the signal line and the selection line.

5. The element according to claim 1, wherein a microlens connected to the first cavity corresponding thereto is provided in the first substrate located right under each detection cell.

6. The element according to claim 1, wherein each of the first cavities passes through the first substrate, and an opening area on the first insulation film side is narrower than an opening area on a face opposite from the first insulation film.

7. The element according to claim 6, wherein a transmission window which transmits the incident infrared rays is provided on a face of the first substrate opposite from the first insulation film.

8. An infrared imaging element comprising:
   a semiconductor substrate comprising a stacked structure of a silicon first substrate, a first insulation film, and a silicon layer stacked in the cited order, a plurality of first cavities being provided on a surface of the first substrate on a side of the first insulation film;
   an infrared detection unit provided in the semiconductor substrate to detect incident infrared rays, the infrared detection unit including,
      a plurality of detection cells provided respectively over the plurality of first cavities to detect the incident infrared rays, each of the detection cells having diodes provided in the silicon layer and a second insulation film which covers the diodes, the first insulation film on the first cavity absorbing the incident infrared rays and converting the incident infrared rays to heat, the diodes converting the heat obtained by the first insulation film to an electric signal,
- a first support structure unit provided to correspond to each of the detection cells to support the detection cell over the first cavity corresponding thereto, the first support structure unit having a first connection wiring connected to a selection line to select the detection cell corresponding thereto, and
- a second support structure unit provided to correspond to each of the detection cells to support the detection cell over the first cavity corresponding thereto, the second support structure unit having a second connection wiring connected to a signal line to transfer an electric signal from the detection cell corresponding thereto;

a circuit unit provided in an area of the semiconductor substrate which differs from an area where the infrared detection unit is formed, the circuit unit including a drive circuit which drives the selection line, a signal processing circuit which process the electric signal sent via the signal line, and a third insulation film covering the drive circuit and the signal processing circuit and having a top face located at a greater distance from the semiconductor substrate as compared with a top face of the second insulation film;

a second substrate provided over the third insulation film to cover the infrared detection unit; and a microlens provided in the first substrate located right under each detection cell, and connected to the first cavity corresponding thereto and, wherein a second cavity is formed between the second substrate and the infrared detection unit, and with respect to each detection cell, the first substrate located right under the first cavity functions as a transmission window of the incident infrared rays.

* * * * *